United States Patent
Sumi

(10) Patent No.: US 7,772,748 B2
(45) Date of Patent: Aug. 10, 2010

(54) COMPOSITE FOR FORMING FERROELECTRIC THIN FILM, FERROELECTRIC THIN FILM, METHOD OF MANUFACTURING FERROELECTRIC THIN FILM, AND LIQUID-JET HEAD

(75) Inventor: Koji Sumi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 992 days.

(21) Appl. No.: 10/590,279

(22) PCT Filed: Jun. 29, 2005

(86) PCT No.: PCT/JP2005/011996

§ 371 (c)(1),
(2), (4) Date: Aug. 22, 2006

(87) PCT Pub. No.: WO2006/006406

PCT Pub. Date: Jan. 19, 2006

(65) Prior Publication Data

US 2007/0190238 A1    Aug. 16, 2007

(30) Foreign Application Priority Data

Jul. 13, 2004    (JP)    .............................. 2004-206225

(51) Int. Cl.
*H01L 41/187* (2006.01)
*C04B 35/00* (2006.01)
*C23C 16/40* (2006.01)
*B41K 3/00* (2006.01)

(52) U.S. Cl. .................. 310/358; 101/94; 501/134; 106/287.19

(58) Field of Classification Search ................ 310/358; 427/100, 126.3, 383.1; 501/134; 106/287.19; 101/94
See application file for complete search history.

(56) References Cited

U.S. PATENT DOCUMENTS

| 6,126,998 | A | 10/2000 | Hintermaier et al. |
| 6,247,799 | B1 | 6/2001 | Sakamaki et al. |
| 2001/0016229 | A1* | 8/2001 | Sun et al. ................. 427/376.2 |
| 2002/0123158 | A1* | 9/2002 | Murai ........................... 438/3 |

FOREIGN PATENT DOCUMENTS

| JP | 04362015 A | * 12/1992 |
| JP | 6-5946 A | 1/1994 |
| JP | 7-206442 A | 8/1995 |
| JP | 8-316433 A | 11/1996 |
| JP | 2001-322286 A | 11/2001 |
| JP | 2002-246670 A | 8/2002 |
| JP | 2004-111850 A | 4/2004 |

* cited by examiner

*Primary Examiner*—Thomas M Dougherty
(74) *Attorney, Agent, or Firm*—Sughrue Mion, PLLC

(57) ABSTRACT

Provided are a composite for forming a ferroelectric thin film which is a colloidal solution applicable to the MOD method and capable of maintaining excellent dispersion stability and preservation stability of an organometallic compound over a long term, a ferroelectric thin film, a method of manufacturing a ferroelectric thin film, and a liquid-jet head. A composite for forming a ferroelectric thin film, which is made of a colloidal solution applicable to the MOD method containing an organometallic compound including metal constituting a ferroelectric thin film, and contains water other than water of crystallization in the organometallic compound is used when forming a ferroelectric thin film in accordance with the MOD method.

3 Claims, 2 Drawing Sheets

(a)

(b)

COMPOSITE FOR FORMING FERROELECTRIC THIN FILM, FERROELECTRIC THIN FILM, METHOD OF MANUFACTURING FERROELECTRIC THIN FILM, AND LIQUID-JET HEAD

BACKGROUND

1. Technical Field

The present invention relates to a composite for forming a ferroelectric thin film used for forming a ferroelectric thin film in accordance with the MOD (metal organic deposition) method, a ferroelectric thin film, a method of manufacturing a ferroelectric thin film, and a liquid-jet head.

2. Related Art

A ferroelectric thin film containing a crystal represented by lead zirconate titanate (PZT) and the like possesses spontaneous polarization, high dielectric constant, an electro-optic effect, a piezoelectric effect, a pyroelectric effect, and the like and is therefore applied to a wide range of device development including piezoelectric elements. Meanwhile, methods such as the MOD method, the sol-gel method, the CVD (chemical vapor deposition) method and the sputtering method are known as the methods of forming such a ferroelectric thin film. In particular, the MOD method and the sol-gel method have an advantage that it is possible to form a ferroelectric thin film easily and at relatively low costs.

When forming the ferroelectric thin film in accordance with the MOD method, the film is typically formed by dissolving an organometallic compound such as a metal alkoxide in an alcohol, coating a colloidal solution obtained by adding a hydrolysis inhibitor or the like thereto on a target object, and drying and sintering the solution on the target object. Meanwhile, when forming the ferroelectric thin film in accordance with the sol-gel method, the film is formed as similar to the MOD method except that the method applies a colloidal solution obtained by dissolving an organometallic compound in an alcohol and subjecting this organometallic compound solution to hydrolysis and a polycondensation reaction while adding the required minimum amount of water thereto (see Patent Document 1, for example).

Here, the methods of manufacturing a ferroelectric thin film applying the MOD method and the sol-gel method will be described in detail. A composite for forming a ferroelectric thin film pooled in a tank is conveyed to a nozzle which is disposed above a target object by use of dry inert gas (carrier gas) such as dry nitrogen gas, and the composite for forming a ferroelectric thin film is dropped from the nozzle onto the rotating target object. In this way, a precursor film is formed on the target object and then turned into gel by drying and degreasing, and a ferroelectric thin film is manufactured by further sintering the film on the target object.

However, in terms of the composite for forming a ferroelectric thin film used for forming the ferroelectric thin film in accordance with the MOD method or the sol-gel method, the alcohol (the solvent) contained in the composite for forming a ferroelectric thin film vaporizes in the dry inert gas environment where the composite contacts the dry inert gas. As a result, there is a problem of deterioration in dispersion stability of the organometallic compound which leads to sol aggregation and deposition. Moreover, when the composite for forming a ferroelectric thin film is pooled in the tank or the like for a certain period, there is also a problem of deterioration in preservation stability of the composite for a ferroelectric thin film (the organometallic compound) attributable to sol deposition.

Here, when the sol is deposited, the sol composition in the composite for a ferroelectric thin film may be altered and a film component in the ferroelectric thin film may be unevenly dispersed, whereby a piezoelectric characteristic of a piezoelectric element including the ferroelectric thin film may fluctuate. In addition, in a liquid-jet head including the piezoelectric element as a piezoelectric actuator, the fluctuation of the piezoelectric characteristic of the piezoelectric element may lead to unevenness in a liquid-jet characteristic.

Patent Document 1: JP-A-6-5946

DISCLOSURE OF THE INVENTION

Problem to be Solved by the Invention

In view of the foregoing circumstances, it is an object of this invention to provide a composite for forming a ferroelectric thin film which is a colloidal solution applicable to the MOD method and capable of maintaining excellent dispersion stability and preservation stability of an organometallic compound over a long term, and to provide a ferroelectric thin film, a method of manufacturing a ferroelectric thin film, and a liquid-jet head.

Means for Solving the Problem

To solve the problem, a first aspect of this invention provides a composite for forming a ferroelectric thin film made of a colloidal solution applicable to the MOD method containing an organometallic compound including metal constituting a ferroelectric thin film, which includes at least water other than water of crystallization in the organometallic compound.

In the first aspect, water having a relatively high boiling point is contained. Therefore, it is possible to maintain excellent dispersion stability and preservation stability of the organometallic compound over a long term in a dry inert gas environment.

A second aspect of this invention provides the composite for forming a ferroelectric thin film according to the first aspect, in which molar quantity of the water other than the water of crystallization in the organometallic compound is 1 to 10 times as much as total molar quantity of the metal contained in the colloidal solution.

In the second aspect, viscosity of the composite for forming a ferroelectric thin film has an optimal value in terms of formation of the ferroelectric thin film. Therefore, it is possible to form the ferroelectric thin film relatively easily.

A third aspect of this invention provides the composite for forming a ferroelectric thin film according to the second aspect, in which the molar quantity of the water other than the water of crystallization in the organometallic compound is 5 to 7 times as much as the total molar quantity of the metal contained in the colloidal solution.

In the third aspect, the viscosity of the composite for forming a ferroelectric thin film has an even more optimal value in terms of formation of the ferroelectric thin film. Therefore, it is possible to form the ferroelectric thin film relatively easily.

A fourth aspect of this invention provides a ferroelectric thin film which is made of the composite for forming a ferroelectric thin film according to any one of the first to third aspects.

In the fourth aspect, it is possible to realize a ferroelectric thin film having a film component that is dispersed almost evenly and a stable piezoelectric characteristic relatively easily.

A fifth aspect of this invention provides a liquid-jet head including a piezoelectric element having the ferroelectric thin film according to the fourth aspect as a piezoelectric actuator which ejects a liquid.

In the fifth aspect, it is possible to realize a liquid-jet head having a stable liquid-jet characteristic and high reliability relatively easily.

A sixth aspect of this invention provides a method of manufacturing a ferroelectric thin film including adding water other than water of crystallization in an organometallic compound to a colloidal solution applicable to the MOD method containing the organometallic compound including metal constituting a ferroelectric thin film, coating the obtained composite for forming a ferroelectric thin film on a target object, and forming the ferroelectric thin film by drying and sintering the composite for forming a ferroelectric thin film on the target object.

In the sixth aspect, the composite for forming a ferroelectric thin film containing water having a relatively high boiling point can maintain excellent dispersion stability and preservation stability of the organometallic compound in a dry inert gas environment over a long term. Therefore, a ferroelectric thin film having a film component dispersed almost evenly can be manufactured relatively easily.

A seventh aspect of this embodiment provides the method of manufacturing a ferroelectric thin film according to the sixth aspect, in which the composite for forming a ferroelectric thin film is conveyed to a nozzle connected to a tank pooling the composite for forming a ferroelectric thin film by introducing dry inert gas into the tank, and the composite for forming a ferroelectric thin film is dropped onto the rotating target object from the nozzle when coating the composite for forming a ferroelectric thin film on the target object.

In the seventh aspect, a precursor film having a film component dispersed almost evenly can be manufactured relatively easily.

BEST MODES FOR CARRYING OUT THE INVENTION

The invention will now be described below in detail based on embodiments.

Embodiment 1

A composite for forming a ferroelectric thin film of this invention is a colloidal solution (sol) applicable to the MOD (metal organic deposition) method used for forming a ferroelectric thin film in accordance with the MOD method. To be more precise, the composite includes at least an organometallic compound containing metal constituting a ferroelectric thin film, and water other than water of crystallization in this organometallic compound. The MOD method means a method of obtaining a film or the like simply by coating a solution of either an alcoholate or an organometallic material using an alcoholate as a raw material, drying, and performing a heat treatment only unlike the sol-gel method which causes a gelation reaction. The "water of crystallization in the organometallic compound" means water (water of crystallization) contained in crystals of the organometallic compound constituting the material for forming the ferroelectric thin film, for example. The "water other than the water of crystallization in the organometallic compound" described in this invention means water which is different from the water of crystallization.

Moreover, in this invention, quantity (the content) of the water other than the water of crystallization in the organometallic compound does not have a particular upper limit in light of enhancing the dispersion stability and the preservation stability of the organometallic compound. However, the quantity has an optimal range in consideration of viscosity of the composite for forming a ferroelectric thin film relative to conditions of film-forming processes such as coating, drying and sintering. To be more precise, molar quantity of the water other than the water of crystallization in the organometallic compound is set preferably 1 to 10 times as much as total molar quantity of the metal contained in the organometallic compound solution, or more preferably 5 to 7 times as much as the total molar quantity of the metal contained in the organometallic compound solution.

Here, in the case of a composite for forming a lead zirconate titanate (PZT) thin film applied to formation of a PZT thin film, the "total molar quantity of the metal contained in the organometallic compound solution" is equivalent to total molar quantity of metal elements constituting PZT, namely, lead (Pb), titanium (Ti), and zirconium (Zr).

In addition to the organometallic compound such as a metal alkoxide or an acetate compound, the composite for forming a ferroelectric thin film of this invention used for formation of the ferroelectric thin film in accordance with the MOD method includes an alcohol as a solvent and a hydrolysis inhibitor for inhibiting a hydrolysis of the organometallic compound. For example, the solvent for the organometallic compound may be butoxyethanol, propanol, and the like. For example, the hydrolysis inhibitor may be monoethanolamine, diethanolamine, triethanolamine, acetylacetone, and the like.

Here, a stabilizer for stabilizing the organometallic compound and thereby preventing occurrence of cracks on the ferroelectric thin film, such as polyethyleneglycol, may be added to the composite for forming a ferroelectric thin film of this invention when appropriate. It is also possible to add a thickener and the like as other additives.

Moreover, the composite for a ferroelectric thin film of this invention used for formation of the ferroelectric thin film in accordance with the MOD method contains water having a relatively high boiling point. Accordingly, it is possible to maintain the dispersion stability of the organometallic compound over a long term in a dry inert gas environment, and to prevent sol aggregation and deposition reliably. Moreover, even when the composite for forming a ferroelectric thin film is pooled in a tank with dry inert gas for a certain period, it is possible to prevent deposition of sol reliably. Therefore, it is possible to maintain the preservation stability of the organometallic compound over a long term.

Here, the composite for a ferroelectric thin film of this invention is prepared by adding water other than the water of crystallization in the organometallic compound to a colloidal solution applicable to the MOD method containing the organometallic compound, such as a colloidal solution formed by putting the organometallic compound and the hydrolysis inhibitor into an alcohol (the solvent). As described above, since the organometallic compound solution contains the hydrolysis inhibitor, no hydrolysis is caused between the organometallic compound and the water by adding the water afterwards. This invention exerts a more significant effect particularly in the case of the colloidal solution applicable to the MOD method.

Next, the composite for forming a ferroelectric thin film of this invention will be described further in detail based on Example 1 and Comparative Example 1.

EXAMPLE 1

After putting 2-n-butoxyethanol ($CH_3(CH_2)_3OCH_2CH_2OH$) in an amount of 354 g into a flask, titanium tetraisopropoxide ($Ti((CH_3)_2CHO)_4$)) in an amount of 38.4 g (0.135 mol) is added into this flask. The mixture is agitated at room temperature to prepare a solution A. Next, diethanolamine ($HN(CH_2CH_2OH)_2$) in an amount of 68.8 g is mixed with the solution A in the flask. The mixture is agitated in a room temperature to prepare a solution B. Subsequently, lead acetate trihydrate ($Pb(CH_3COO)_2.3H_2O$) in an amount of 139.8 g (0.368 mol) is added to the solution B in the flask. Then, zirconium acetyl acetonate ($Zr(CH_3COCHCOCH_3)_4$) in an amount of 82.6 g (0.169 mol) is added thereto. This mixture is agitated for 45 minutes while heating up to 70° C. and is then naturally cooled down to a room temperature to prepare a solution C. Thereafter, polyethyleneglycol (($—CH_2CH_2O—$)n) (average molecular weight of 400) in an amount of 34.2 g is added to the solution C in the flask, and the mixture is agitated at room temperature to prepare a solution D. Lastly, pure water in an amount of 36.3 g (2.02 mol) is added to the solution D in the flask, and the mixture is agitated at room temperature to finish a composite for forming a ferroelectric thin film (a composite for forming a $Pb_{1.21}(Zr_{0.556}Ti_{0.444})O_3$ thin film) of Example 1.

COMPARATIVE EXAMPLE 1

A composite for forming a ferroelectric thin film of Comparative Example 1 is prepared in a similar manner to that of Example 1 except the addition of pure water.

TEST EXAMPLE 1

A test is performed by measuring and comparing time periods required for sol deposition in dry nitrogen gas atmosphere in terms of the composites for a ferroelectric thin film of Example 1 and Comparative Example 1 described above. As a result, in Comparative Example 1, sol deposition already begins at a lapse of 72 hours. On the contrary, in Example 1, no sol deposition is observed after a lapse of 1000 hours. From this test result, it is apparent that the composite for forming a ferroelectric thin film of Example 1 containing the pure water other than the water of crystallization in the lead acetate trihydrate can maintain excellent dispersion stability and preservation stability over a long term as compared to the composite for forming a ferroelectric thin film of Comparative Example 1 not containing the pure water other than the water of crystallization in the lead acetate trihydrate.

Here, the ferroelectric thin film formed by use of the above-described composite for forming a ferroelectric thin film for instance contains crystals of a ferroelectric material (a piezoelectric material) such as lead titanate zirconate (PZT) or crystals of a relaxor ferroelectric material obtained by adding metal such as niobium, nickel, magnesium, bismuth, yttrium, ytterbium or the like thereto. For example, the composition thereof may be $PbTiO_3$ (PT), $PbZrO_3$(PZ), $Pb(Zr_xTi_{1-x})O_3$ (PZT), $Pb(Mg_{1/3}Nb_{2/3})O_3$—$PbTiO_3$(PMN-PT), $Pb(Zn_{1/3}Nb_{2/3})O_3$—$PbTiO_3$(PZN-PT), $Pb(Ni_{1/3}Nb_{2/3})O_3$—$PbTiO_3$ (PNN-PT), $Pb(In_{1/2}Nb_{1/2})O_3$—$PbTiO_3$(PIN-PT), $Pb(Sc_{1/2}Ta_{1/2})O_3$—$PbTiO_3$(PST-PT), $Pb(Sc_{1/2}Nb_{1/2})O_3$—$PbTiO_3$ (PSN-PT), $BiScO_3$—$PbTiO_3$(BS-PT), $BiYbO_3$—$PbTiO_3$ (BY-PT), and the like.

The ferroelectric thin film of this invention is made of the composite for forming a ferroelectric thin film having the excellent dispersion stability and preservation stability in terms of the organometallic compound. Accordingly, the film component is dispersed almost evenly, or in other words, film quality of the ferroelectric thin film becomes almost uniform. Therefore, the ferroelectric thin film can exert a stable piezoelectric characteristic.

Here, the above-described composite for forming a ferroelectric thin film of this embodiment and the ferroelectric thin film formed by use of this composite for forming a ferroelectric thin film are applicable to a wide range of device development. Although applications and the like thereof are not particularly limited, possible applications for instance include a microactuator, a filter, a delay line, a reed selector, a tuning fork oscillator, a tuning fork clock, a transceiver, a piezoelectric pickup, a piezoelectric earphone, a piezoelectric microphone, a SAW filter, an RF modulator, a resonator, a delay element, a multistrip coupler, a piezoelectric accelerometer, a piezoelectric speaker, and the like.

Moreover, the method of manufacturing a ferroelectric thin film of this invention includes the process of preparing the composite for forming a ferroelectric thin film by adding the hydrolysis inhibitor and the like to the solution obtained by dissolving the organometallic compound into the solvent such as an alcohol, and then adding the water other than the water of crystallization in the organometallic compound thereto. The ferroelectric thin film is formed by coating the prepared composite for forming a ferroelectric thin film on a target object, and then subjecting the composite for forming a ferroelectric thin film on the target object to drying, degreasing, and sintering.

In this way, according to the method of manufacturing a ferroelectric thin film of this invention, the composite for forming a ferroelectric thin film containing water having a relatively high boiling point can maintain excellent dispersion stability and preservation stability of the organometallic compound over a long term in a dry inert gas environment. Therefore, the ferroelectric thin film having the film component that is dispersed almost evenly, or in other words, having almost uniform film quality can be formed relatively easily.

Meanwhile, in the step of coating the composite for forming a ferroelectric thin film on the target object, it is preferable to introduce dry inert gas into a tank pooling the composite for forming a ferroelectric thin film at a given flow rate, to convey the composite for forming a ferroelectric thin film to a nozzle which is connected to the tank, and to drop the composite for forming a ferroelectric thin film onto the rotating target object from the nozzle. In this way, a precursor film for the ferroelectric thin film having a film component dispersed almost evenly can be manufactured relatively easily.

Embodiment 2

Next, an inkjet recording head representing an example of a liquid-jet head applying the present invention to a piezoelectric actuator will be described in detail with reference to FIG. 1 to FIG. 2 (b). FIG. 1 is an exploded perspective view showing an outline of an inkjet recording head representing an example of the liquid-jet head. FIGS. 2(a) and 2(b) are a plan view and a cross-sectional view taken along the A-A' line in FIG. 1. As shown in FIG. 1 to FIG. 2(b), a passage-forming substrate 10 is made of a single crystal silicon substrate having the plane orientation (110) in this embodiment, and an elastic film 50 having a thickness in a range from 0.5 to 2 μm, which is made of silicon dioxide ($SiO_2$) formed in advance by thermal oxidation, is formed on one surface thereof.

A plurality of pressure generating chambers 12 partitioned by a plurality of compartment walls 11 are arranged on this passage-forming substrate 10 by subjecting the single crystal silicon substrate to anisotropic etching from one surface side thereof. Meanwhile, a communicating portion 13 to communicate with a reservoir portion 32 of a protection plate 30 to be described later is formed outside an end portion in a direction (the longitudinal direction)orthogonal to the direction (the width direction) of arrangement of the pressure generating chambers 12. Moreover, this communicating portion 13 communicates with an end portion in the longitudinal direction of each of the pressure generating chambers 12 respectively through an ink supply path 14.

Moreover, a mask film 51 used for formation of the pressure generating chambers 12 is provided on an open surface side of the passage-forming substrate 10. A nozzle plate 20 provided with nozzle orifices 21, which communicate with the vicinity of end portions of the respective pressure generating chambers 12 on the opposite side of the ink supply paths 14, by drilling, is fixed onto this mask film 51 with an adhesive agent, a thermowelding film or the like.

Meanwhile, an insulating film 55 having a thickness of about 0.4 μm, for example, is formed on the elastic film 50 on the opposite side of the open surface of the above-described passage-forming substrate 10. On this insulating film 55, a lower electrode film 60 having a thickness of about 0.2 μm, for example, a ferroelectric thin film (a piezoelectric layer) 70 having a thickness of about 1 μm, for example, and an upper electrode film 80 having a thickness of about 0.05 μm, for example, are formed by lamination in accordance with a process to be described later and collectively constitute a piezoelectric element 300. Here, the ferroelectric thin film 70 of this embodiment is formed of the composite for forming a ferroelectric thin film made of a colloidal solution applicable to the MOD method, which is obtained by adding the water other than the water of crystallization in the organometallic compound to the solution of the organometallic compound.

Here, the piezoelectric element 300 means a portion including the lower electrode film 60, the ferroelectric thin film 70, and the upper electrode film 80. In general, one of the electrodes of the piezoelectric element 300 is used as a common electrode, and the other electrode and the ferroelectric thin film 70 are patterned in conformity to the respective pressure generating chambers 12. Moreover, the portion including the one of the electrodes and the ferroelectric thin film 70 thus patterned, which generates piezoelectric strain upon application of a voltage to the both electrodes, will herein be referred to as a piezoelectric active portion. In this embodiment, the lower electrode film 60 is used as the common electrode to the piezoelectric element 300 while the upper electrode film 80 is used as an individual electrode of the piezoelectric element 300. However, there is no problem when the configuration is inverted due to the convenience of drive circuits or wiring. In any case, the piezoelectric active portion is formed for each of the pressure generating chambers 12. Moreover, the piezoelectric element 300 and a vibration plate to be displaced by a drive of the piezoelectric element 300 will herein be collectively referred to as a piezoelectric actuator. Here, the elastic film 50, the insulating film 55, and the lower electrode film 60 collectively act as the vibration plate in this embodiment.

In addition, a protection plate 30 including a piezoelectric element holding portion 31 capable of ensuring an adequate space for not inhibiting actions of the piezoelectric elements 300 is joined to the passage-forming substrate 10 on the side provided with the piezoelectric elements 300 with an adhesive agent. The piezoelectric elements 300 are formed inside this piezoelectric element holding portion 31 and are therefore protected in the state hardly susceptible to influences of an external environment. Here, the space inside the piezoelectric element holding portion 31 may be hermetically sealed or not be hermetically sealed.

Moreover, the protection plate 30 is provided with a reservoir portion 32 which constitutes at least part of a reservoir 100 serving as a common ink chamber to the respective pressure generating chambers 12. As described previously, this reservoir portion 32 communicates with the communicating portion 13 of the passage-forming substrate 10 and thereby constitutes the reservoir 100 serving as the common ink chamber to the respective pressure generating chambers 12. Meanwhile, a through hole 33 is formed on the protection plate 30 in a region between the piezoelectric element holding portion 31 and the reservoir portion 32 so as to penetrate the protection plate 30 in the thickness direction. Further, the vicinity of an end portion of each lead electrode 90 extracted from each of the piezoelectric elements 300 is exposed inside the through hole 33.

In addition, a compliance plate 40 including a sealing film 41 and a stationary plate 42 is joined onto the above-described protection plate 30. Here, the stationary plate 42 is made of a hard material such as metal. A region of this stationary plate 42 opposite the reservoir 100 is completely removed in the thickness direction and thereby formed into an opening portion 43. Accordingly, one side of the reservoir 100 is sealed only by the sealing film 41 having flexibility.

In the above-described inkjet recording head of this embodiment, ink is brought in from unillustrated external ink supplying means. After the inside ranging from the reservoir 100 to the nozzle orifices 21 is filled with the ink, a drive voltage is applied between the lower electrode film 60 and the upper electrode film 80 corresponding to each of the pressure generating chambers 12 in accordance with a drive signal from unillustrated drive IC, and the elastic film 50, the insulating film 55, the lower electrode film 60, and the ferroelectric thin film 70 are subjected to flexure deformation. In this way, the pressure inside the respective pressure generating chambers 12 is increased and ink droplets are ejected from the nozzle orifices 21.

In the above-described inkjet recording head of this embodiment, the ferroelectric thin film 70 is made of the organometallic compound and the composite for forming a ferroelectric thin film containing water other than the water of crystallization in this organometallic compound, or in other words, the composite for forming a ferroelectric thin film having the excellent dispersion stability and preservation stability of the organometallic compound. Accordingly, the film component of the ferroelectric thin film 70 is dispersed almost evenly, and the film quality of the ferroelectric thin film 70 becomes almost uniform. Therefore, it is possible to stabilize an ink ejection characteristic of the head and to improve reliability of the head.

Although this embodiment has been described on the inkjet recording head configured to eject ink as an example of the liquid-jet head, the liquid-jet head will not be limited only to the foregoing. For example, the liquid-jet head may be a recording head used in an image recording device such as a printer, a color material ejection head used for manufacturing a color filter for a liquid crystal display and the like, an electrode material ejection head used for forming electrodes in an organic EL display, an FED (field emission display) and the like, a living organic material ejection head used for manufacturing a biochip, and the like.

EXPLANATION OF REFERENCED NUMERALS

Figure 1:
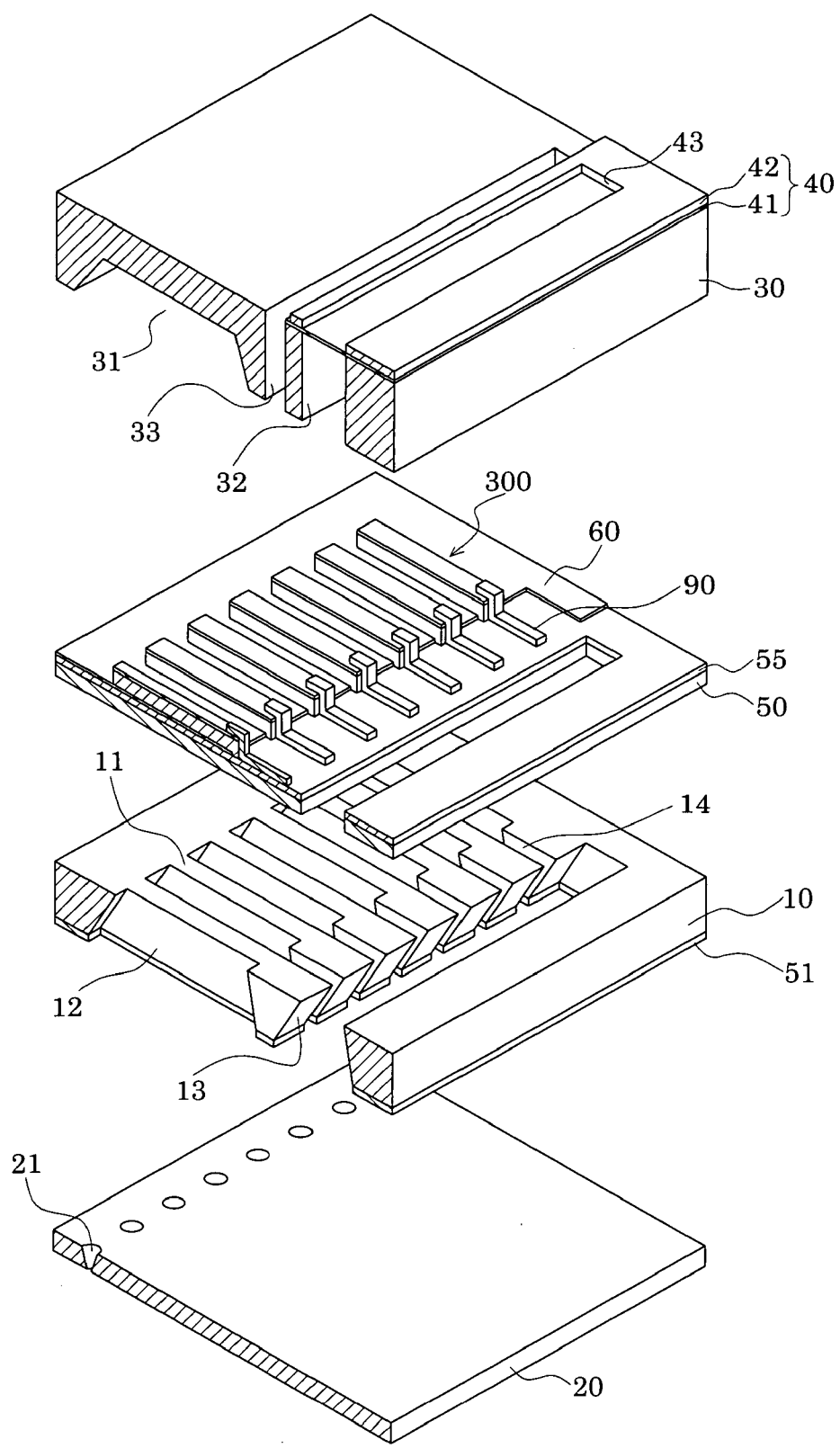
FIG. 1 is an exploded perspective view showing an outline of a recording head according to Embodiment 2 of the invention.
Figure 2:
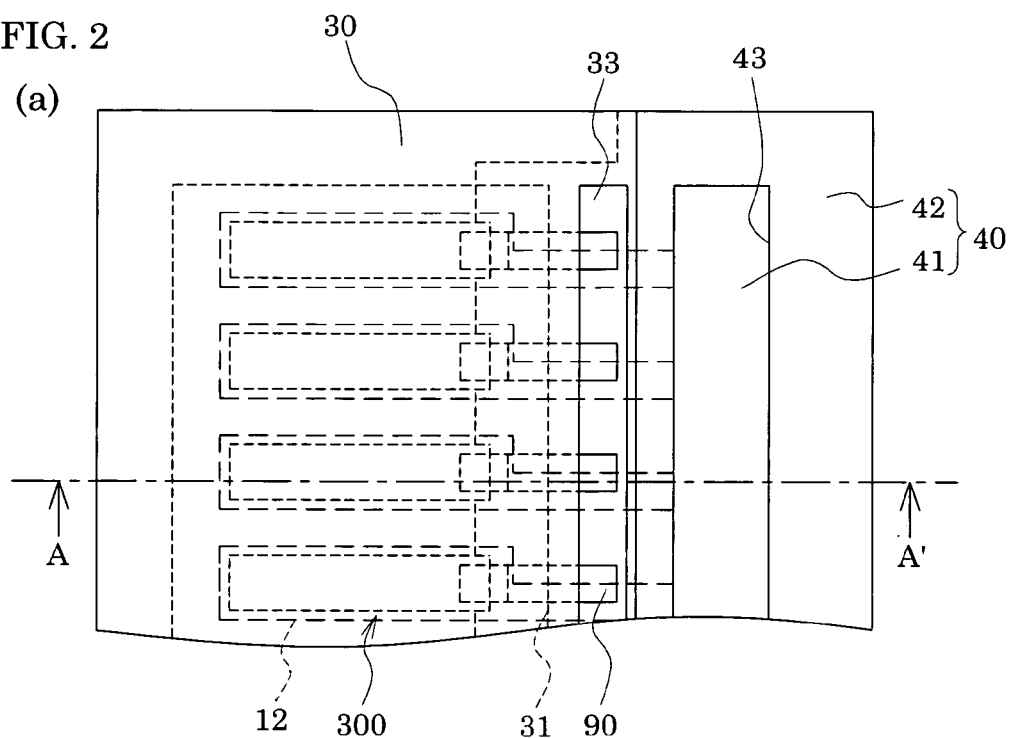
FIGS. 2(*a*) and 2(*b*) are a plan view and a cross-sectional view taken along the A-A' line of the recording head according to Embodiment 2 of the invention.
Figure 2:
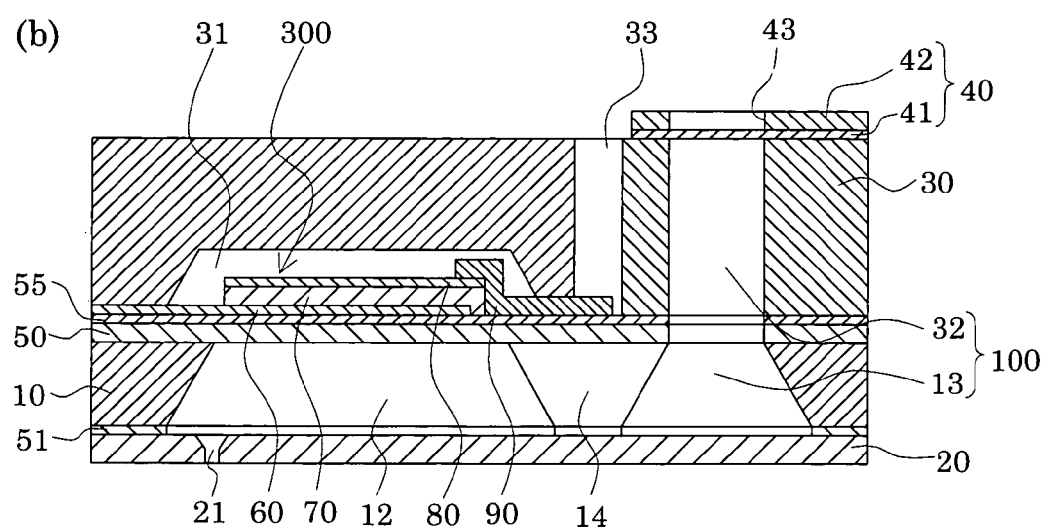

10 PASSAGE-FORMING SUBSTRATE
12 PRESSURE GENERATING CHAMBER
20 NOZZLE PLATE
21 NOZZLE ORIFICE
30 PROTECTION PLATE
31 PIEZOELECTRIC ELEMENT HOLDING PORTION
32 RESERVOIR PORTION
40 COMPLIANCE PLATE
60 LOWER ELECTRODE FILM
70 FERROELECTRIC THIN FILM (PIEZOELECTRIC LAYER)
80 UPPER ELECTRODE FILM
90 LEAD ELECTRODE
100 RESERVOIR
300 PIEZOELECTRIC ELEMENT

The invention claimed is:

1. A composite for forming a ferroelectric thin film made of a colloidal solution applicable to the metal organic deposition method containing an organometallic compound including metal constituting a ferroelectric thin film, comprising:
   at least water other than water of crystallization in the organometallic compound.

2. A ferroelectric thin film made of the composite for forming a ferroelectric thin film according to claim 1.

3. A liquid-jet head comprising:
   a piezoelectric element including the ferroelectric thin film according to claim 2 as a piezoelectric actuator that ejects a liquid.

* * * * *